(12) United States Patent
Hong et al.

(10) Patent No.: US 7,037,801 B1
(45) Date of Patent: May 2, 2006

(54) METHOD FOR FORMING CAPACITOR OF SEMICONDUCTOR DEVICE

(75) Inventors: Kwon Hong, Kyoungki-do (KR); Deok Sin Kil, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/122,834

(22) Filed: May 5, 2005

(30) Foreign Application Priority Data

Nov. 8, 2004 (KR) .................. 10-2004-0090413

(51) Int. Cl.
*H01L 21/8242* (2006.01)

(52) U.S. Cl. .............. 438/396; 438/240; 438/253; 438/685; 438/785

(58) Field of Classification Search .......... 438/240, 438/243, 250, 253, 386, 393, 648, 656, 685, 438/785, FOR. 212, FOR. 220, FOR. 430, 438/396

See application file for complete search history.

(56) References Cited

U.S. PATENT DOCUMENTS

| | | | |
|---|---|---|---|
| 6,696,332 B1* | 2/2004 | Visokay et al. ............. 438/216 |
| 6,900,106 B1* | 5/2005 | Basceri et al. ............. 438/396 |
| 2002/0086507 A1* | 7/2002 | Park et al. .................. 438/585 |
| 2003/0205750 A1* | 11/2003 | Basceri et al. ............. 257/301 |
| 2003/0213987 A1* | 11/2003 | Basceri et al. ............. 257/296 |
| 2003/0222300 A1* | 12/2003 | Basceri et al. ............. 257/309 |
| 2004/0046197 A1* | 3/2004 | Basceri et al. ............. 257/296 |
| 2005/0020026 A1* | 1/2005 | Basceri et al. ............. 438/399 |
| 2005/0142715 A1* | 6/2005 | Sakoda et al. ............. 438/197 |
| 2005/0260357 A1* | 11/2005 | Olsen et al. ................ 427/569 |

* cited by examiner

*Primary Examiner*—George Fourson
*Assistant Examiner*—Joannie Adelle Garcia
(74) *Attorney, Agent, or Firm*—Ladas & Parry LLP

(57) ABSTRACT

Disclosed is a method for forming a capacitor of a semiconductor device, which can ensure charging capacity required as well as an excellent leakage current characteristic. In such a method, a storage electrode consisting of TiN is formed on a semiconductor substrate. Then, a first HfO2 thin film, an HfxAlyOz thin film and a second HfO2 thin film are successively deposited on the storage electrode using Atomic layer Deposition (ALD) processes to form an HfO2/HfxAlyOz/HfO2 dielectric film. Finally, a plate electrode consisting of TiN is formed on the HfO2/HfxAlyOz/HfO2 dielectric film.

9 Claims, 2 Drawing Sheets

METHOD FOR FORMING CAPACITOR OF SEMICONDUCTOR DEVICE

BACKGROUND OF THE INVENTION

1. Field of the Invention

The present invention relates generally to a method for forming a capacitor of a semiconductor device, and more particularly to a method for forming a capacitor of a semiconductor device, which can improve a leakage current characteristic of HfO2 applied as a dielectric film of the capacitor by suppressing low-temperature crystallization thereof.

2. Description of the Prior Art

Recently, cells of a DRAM device has occupied a smaller area with increase in a degree of integration of the DRAM device, so it becomes more and more difficult to ensure charging capacity required. As is well known in the art, the charging capacity of a capacitor is proportional to an area of an electrode and a dielectric constant of a dielectric film, and is inversely proportional to a distance between electrodes, that is, a thickness of the dielectric film. For ensuring charging capacity required, therefore, it is necessary to reduce the thickness of the dielectric film or to apply materials having a large dielectric constant as the dielectric film.

Thereupon, in order to ensure charging capacity required, researches are being vigorously pursued to replace the existing Oxide-Nitride-Oxide (ONO) dielectric film by a single dielectric film of Al2O3 ($\epsilon$=9), a single dielectric film of HfO2 ($\epsilon$=20) or a dual dielectric film of simply laminated HfO2/Al2O3.

However, Al2O3 has a restriction on ensuring charging capacity because its dielectric constant is not so different from that of the existing Si3N4 material ($\epsilon$=7), and HfO2 has a poor leakage current characteristic caused by a low crystallization temperature although it has a large dielectric constant. The dual dielectric film of HfO2/Al2O3 also has a limitation on reducing an equivalent oxide thickness (EOT; Tox) due to the small dielectric constant of Al2O3.

In the end, the single dielectric film structure of Al2O3 or HfO2 and the dual dielectric film structure of HfO2/Al2O3 may ensure charging capacity required for a capacitor of a highly integrated device such as a 65 nm-grade device, but cannot satisfy the leakage current characteristic of the capacitor. Consequently, the development of a dielectric film applicable to the 65 nm-grade device must be settled without delay.

SUMMARY OF THE INVENTION

Accordingly, the present invention has been made to solve the above-mentioned problem occurring in the prior art, and an object of the present invention is to provide a method for forming a capacitor of a semiconductor device, in which HfO2 is applied as a dielectric film of the capacitor while increase of a leakage current due to a low crystallization temperature of HfO2 can be prevented.

A further object of the present invention is to provide a method for forming a capacitor of a semiconductor device, in which not only desired charging capacity can be secured by applying HfO2 as a dielectric film of the capacitor, but also an excellent leakage current characteristic can be ensured.

In order to accomplish these objects, there is provided a method for forming a capacitor of semiconductor device in accordance with one aspect of the present invention, the method comprising the steps of: forming a storage electrode consisting of TiN on a semiconductor substrate; successively depositing a first HfO2 thin film, an HfxAlyOz thin film and a second HfO2 thin film on the storage electrode using Atomic layer Deposition (ALD) processes to form an HfO2/HfxAlyOz/HfO2 dielectric film; and forming a plate electrode consisting of TiN on the HfO2/HfxAlyOz/HfO2 dielectric film.

Here, the storage electrode and the plate electrode are deposited with a thickness of 50 to 300 Å, respectively.

Also, the first and second HfO2 thin films are deposited with a thickness of 30 to 80 Å, respectively.

The HfxAlyOz thin film is deposited with a thickness of 5 to 15 Å, and is deposited by performing a first deposition cycle, in which Hf source gas flowing, N2 purging, O3 gas flowing and N2 purging progress successively, and a second deposition cycle, in which Al source gas flowing, N2 purging, O3 gas flowing and N2 purging progress successively, in the ratio of 1:1 to 9:1.

In accordance with another aspect of the present invention, the above-mentioned objects are achieved by providing a method for forming a capacitor of a semiconductor device, the method comprising the steps of: forming a storage electrode consisting of TiN on a semiconductor substrate; successively depositing a first HfxAlyOz thin film, an HfO2 thin film and a second HfxAlyOz thin film on the storage electrode using Atomic layer Deposition (ALD) processes to form an HfxAlyOz/HfO2/HfxAlyOz dielectric film; and forming a plate electrode consisting of TiN on the HfxAlyOz/HfO2/HfxAlyOz dielectric film.

Here, the storage electrode and the plate electrode are deposited with a thickness of 50 to 300 Å, respectively.

Also, the HfO2 thin film is deposited with a thickness of 20 to 60 Å.

The first and second HfxAlyOz thin films are deposited with a thickness of 5 to 15 Å, respectively.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
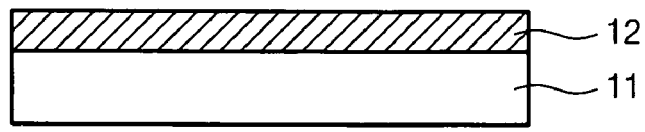
FIGS. 1a to 1c are process-by-process sectional views for explaining a method for forming a capacitor in accordance with a preferred embodiment of the present invention.

Hereinafter, preferred embodiments of the present invention will be described with reference to the accompanying drawings. In the following description and drawings, the same reference numerals are used to designate the same or similar components, and so repetition of the description on the same or similar components will be omitted.

In a method for forming a capacitor of a semiconductor device according to the present invention, a dielectric film of the capacitor essentially consists of HfO2. However, in contrast with a conventional single or dual dielectric film, an HfxAlyOz thin film having a larger dielectric constant than that of Al2O3 is interposed between HfO2 thin films during the deposition of the HfO2 thin films to form the dielectric film in a triple structure of HfO2/HfxAlyOz/HfO2.

In connection with interposing the HfxAlyOz thin film dielectric constant of which is larger than that of Al2O3 between the HfO2 thin films, the dielectric film of the present invention can reduce an equivalent oxide thickness (Tox) more than in the conventional dual dielectric film structure and thus ensure charging capacity required. In particular, since the HfxAlyOz thin film suppresses the crystallization of HfO2, the dielectric film of the present invention can improve the problem of a leakage current caused by a low crystallization temperature when HfO2 is used as the dielectric film.

Accordingly, the HfO2/HfxAlyOz/HfO2 dielectric film according to the present invention makes it possible to manufacture a capacitor which has charging capacity and a leakage characteristic required for a 65 nm-grade device.

FIGS. 1 a to 1c illustrate process-by-process sectional views for explaining a method for forming a capacitor of a semiconductor device in accordance with a preferred embodiment of the present invention, for which a description will be given below in detail.

Referring to FIG. 1a, TiN is deposited on a semiconductor device 11, which is formed with sub patterns including transistors and bit lines, to form a storage electrode 12 consisting of TiN. At this time, TiN is deposited with a thickness of 50 to 300 Å according to an Atomic layer Deposition (ALD) technique or a Chemical Vapor Deposition (CVD) technique. Although FIG. 1 represents that the storage electrode 12 has a simple flat plate-like structure, the storage electrode 12 may be formed in a three-dimensional structure such as a concave structure and a cylindrical structure.

Figure 1B:
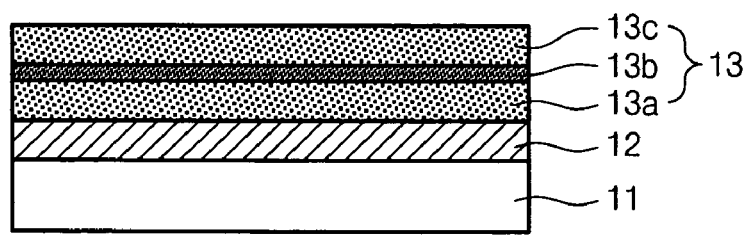

Referring to FIG. 1b, a first HfO2 thin film 13a, an HfxAlyOz thin film 13b and a second HfO2 thin film 13c are successively deposited on the storage electrode 12 to form an HfO2/HfxAlyOz/HfO2 dielectric film 13. At this time, each of the first and second HfO2 thin films 13a, 13c is deposited by repeatedly performing a deposition cycle, in which Hf source gas flowing, N2 purging, O3 gas flowing and N2 purging progress successively, according to an ALD technique until its desired thickness is obtained. The HfxAlyOz thin film 13b is deposited by repeatedly performing a first deposition cycle, in which Hf source gas flowing, N2 purging, 3 gas flowing and N2 purging progress successively, and a second deposition cycle, in which Al source gas flowing, N2 purging, O3 gas flowing and N2 purging progress successively, the number of times desired for each cycle. For example, the first and second HfO2 thin films 13a, 13c are deposited with a thickness of 30 to 80 Å, respectively. The HfxAlyOz thin film 13b is deposited with a thickness of 5 to 15 Å by performing the first and second deposition cycles in the ratio of 1:1 to 9:1.

Figure 1C:
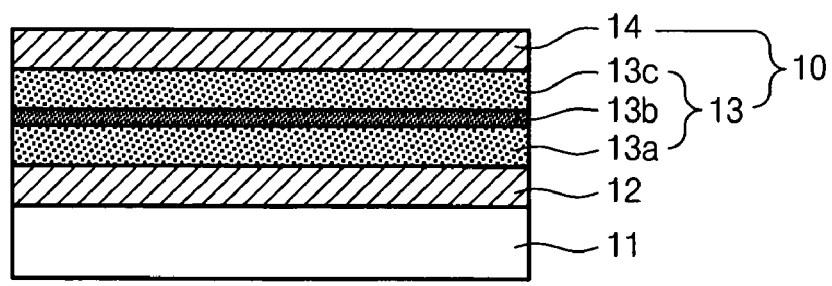

Referring to FIG. 1c, TiN having a thickness of 20 to 300 Å is deposited on the HfO2/HfxAlyOz/HfO2 dielectric film 13 according to an ALD or CVD technique. In this way, the formation of an MIM structure capacitor 10 in accordance with the present invention is completed.

In the so-formed capacitor of the present invention, since the HfxAlyOz thin film is interposed between the HfO2 thin films, a large dielectric constant of HfO2 can be utilized to the maximum extent possible and thus desired charging capacity can be ensured. In addition, the HfxAlyOz thin film suppresses low-temperature crystallization of HfO2, so that a leakage current characteristic of the capacitor can be improved.

In the above-mentioned embodiment, the dielectric film is formed in a triple structure of HfO2/HfxAlyOz/HfO2. In contrast with this embodiment, when a first HfxAlyOz thin film 23a and a second HfxAlyOz thin film 23c are deposited before and after the deposition of a HfO2 thin film 23b, that is, the first HfxAlyOz thin film 23a, the HfO2 thin film and the second HfxAlyOz thin film 23c are successively deposited to form a dielectric film 23 in a triple structure of HfxAlyOz/HfO2/HfxAlyOz as shown in FIG. 2 illustrating another preferred embodiment of the present invention, a capacitor 20 having the same characteristics as those of the capacitor according to the above-mentioned embodiment can be manufactured.

Figure 2:
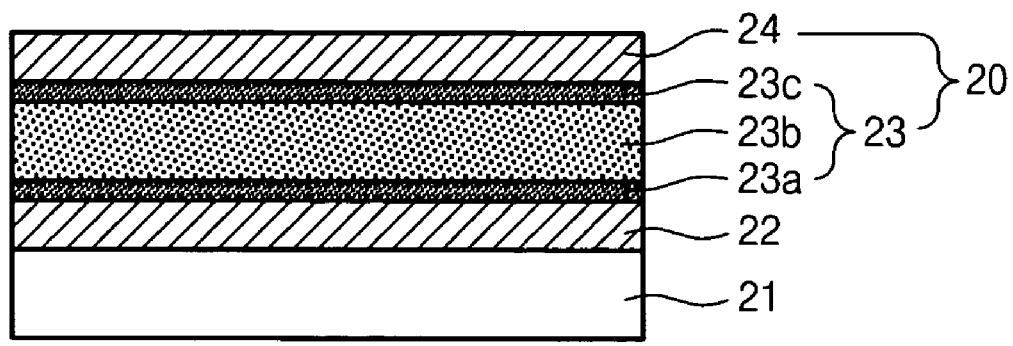
FIG. 2 is a sectional view of a capacitor formed by a forming method in accordance with another preferred embodiment of the present invention.

In FIG. 2, unexplained reference numerals '21', '22' and '24' designate the semiconductor substrate, the TiN storage electrode and the TiN plate electrode, respectively.

As described above, in the method for forming a capacitor according to the present invention, HfO2 is used as a dielectric film while an HfxAlyOz thin film is used for complementing a leakage current problem due to a low crystallization temperature of HfO2, so that an excellent leakage current characteristic and large charging capacity can be obtained even when the capacitor has a small physical thickness. Consequently, it is possible to realize a capacitor applicable to a 65 nm-grade device, which has a dielectric film with a small equivalent oxide thickness and a low leakage current.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor of semiconductor device, the method comprising the steps of:
   forming a storage electrode consisting of TiN on a semiconductor substrate;
   successively depositing on the storage electrode a first HfO2 film, an HfxAlyOz film wherein each of x, y, and z is greater than zero, and a second HfO2 film using Atomic layer Deposition ALD) processes to form an HfO2/HfxAlyOz/HfO2 dielectric film; and
   forming a plate electrode consisting of TiN on the HfO2/HfxAlyOz/HfO2 dielectric film.

2. The method as claimed in claim 1, wherein the storage electrode and the plate electrode are deposited with a thickness of 50 to 300 Å, respectively.

3. The method as claimed in claim 1, wherein the first and second HfO2 films are deposited with a thickness of 30 to 80 Å, respectively.

4. The method as claimed in claim 1, wherein the HfxAlyOz film is deposited with a thickness of 5 to 15 Å.

5. The method as claimed in claim 1 or 4, wherein the HfxAlyOz film and is deposited by performing a first deposition cycle, in which Hf source gas flowing, N2 purging, O3 gas flowing and N2 purging progress successively, and a second deposition cycle, in which Al source gas flowing, N2 purging, O3 gas flowing and N2 purging progress successively, in the ratio of 1:1 to 9:1.

6. A method for forming a capacitor of a semiconductor device, the method comprising the steps of:
forming a storage electrode consisting of TiN on a semiconductor substrate;
   successively depositing on the storage electrode a first HfxAlyOz film wherein each of x, y, and z is greater than zero, an HfO2 film, and a second HfxAlyOz film wherein each of x, y, and z is greater than zero using Atomic layer Deposition (ALD) processes to form an HfO2/HfxAlyOz/HfO2 dielectric film; and forming a plate electrode consisting of TiN on the HfO2/HfxAlyOz/HfO2 dielectric film.

7. The method as claimed in claim 6, wherein the storage electrode and the plate electrode are deposited with a thickness of 50 to 300 Å, respectively.

8. The method as claimed in claim 6, wherein the HfO2 film is deposited with a thickness of 20 to 60 Å.

9. The method as claimed in claim 6, wherein the first and second HfxAlyOz films are deposited with a thickness of 5 to 15 Å, respectively.

\* \* \* \* \*